(12) United States Patent
Breiland et al.

(10) Patent No.: US 8,234,611 B2
(45) Date of Patent: Jul. 31, 2012

(54) SYSTEM AND METHOD FOR MODELING I/O SIMULTANEOUS SWITCHING NOISE

(75) Inventors: Erik Breiland, Colchester, VT (US); Charles S. Chiu, Essex Junction, VT (US); Prince George, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 571 days.

(21) Appl. No.: 12/166,550

(22) Filed: Jul. 2, 2008

(65) Prior Publication Data

US 2010/0005435 A1    Jan. 7, 2010

(51) Int. Cl.
*G06F 17/50* (2006.01)
(52) U.S. Cl. ........ 716/115; 716/106; 716/108; 716/109; 716/110; 716/111; 716/132; 716/133
(58) Field of Classification Search .......... 716/106–115, 716/132–134
See application file for complete search history.

(56) References Cited

U.S. PATENT DOCUMENTS

| | | | |
|---|---|---|---|
| 6,671,865 B1* | 12/2003 | Ali et al. | 716/118 |
| 7,110,930 B2 | 9/2006 | Chiu et al. | |
| 7,412,673 B1* | 8/2008 | Duong | 716/115 |
| 2006/0048081 A1 | 3/2006 | Kiel et al. | |
| 2008/0027662 A1 | 1/2008 | Kouzaki et al. | |

* cited by examiner

*Primary Examiner* — Paul Dinh
(74) *Attorney, Agent, or Firm* — Richard Kotulak; Roberts Mlotkowski Safran & Cole, P.C.

(57) ABSTRACT

The invention generally relates to systems and methods for modeling I/O simultaneous switching noise, and, more particularly, to systems and methods for modeling I/O simultaneous switching noise in a selected chip window area while accounting for the effect of current sharing among neighbors. A method includes determining a current sharing factor of areas of an integrated circuit (IC) chip package, and determining an offload scaling factor of the IC chip package based upon the current sharing factor and numbers of I/O devices in neighboring areas of the IC chip package.

19 Claims, 5 Drawing Sheets

SYSTEM AND METHOD FOR MODELING I/O SIMULTANEOUS SWITCHING NOISE

FIELD OF THE INVENTION

The invention generally relates to systems and methods for modeling I/O simultaneous switching noise, and, more particularly, to systems and methods for modeling I/O simultaneous switching noise in a selected chip window area while accounting for the effect of current sharing among neighboring areas.

BACKGROUND OF THE INVENTION

Integrated circuits (ICs) and packages have become increasingly more complex as clock speeds have exceeded the gigahertz milestone. As a result, it has become increasingly important for IC designers to investigate the performance of designs prior to actual fabrication. A common mechanism to complete this investigation is to simulate input/outputs buffers (I/Os) with modeling to determine the high speed effects on signal integrity, power supply, collapse, noise, etc. Modeling may be completed, for example, using conventional modeling software such as SPICE available from a variety of electronic design automation (EDA) vendors.

One particular performance characteristic that is modeled is Simultaneous Switching Output (SSO) Noise (also referred to as simultaneous switching noise, ground bounce, etc.). The simultaneous switching of multiple I/O drivers on the same chip can cause a temporary voltage variation inside the chip. This temporary voltage variation is referred to as noise. Normally, a small amount of noise is deemed tolerable. However, larger amplitudes of noise may cause the chip to behave in an undesirable fashion. Accordingly, SSO noise of a chip design is often tested via modeling (e.g., simulation) to determine whether it falls within acceptable limits.

Conventional modeling software allows simulation of node switching of the circuits/signals and calculates results such as node voltage, waveform, etc. Ideally, a thorough investigation of design performance would be expected to simulate the entire IC and package. However, simulating an entire IC and package or even a large area thereof, is impracticable due to the large number of circuit elements used on the new ICs.

One common approach of analyzing SSO noise has been to reduce modeling area to a small region (e.g., area, window, etc.) of the chip and package because of the complexity of the structures and I/O models. This small region approach is sometimes referred to as the Generic Package Model (GPM) in an application-specific integrated circuit (ASIC). It gives a worst case result of the noise when modeling the highest density I/O region in the chip/package.

However, the conventional noise modeling technique described above ignores the effects of neighboring areas adjacent to the modeling area. Because of this, conventional noise modeling techniques do not provide an accurate analysis of the SSO noise that will be seen in a manufactured chip.

Accordingly, there exists a need in the art to overcome the deficiencies and limitations described hereinabove.

SUMMARY OF THE INVENTION

In a first aspect of the invention, there is a method for improving simultaneous switching output (SSO) noise analysis. The method comprises determining a current sharing factor of areas of an integrated circuit (IC) chip package, and determining an offload scaling factor of the IC chip package based upon the current sharing factor and numbers of I/O devices in neighboring areas of the IC chip package.

In another aspect of the invention, there is a method for performing an SSO noise analysis. The method comprises providing a computer infrastructure that is structured and arranged to determine an offload scaling factor associated with an IC chip package based upon a current sharing factor of areas of the IC chip package and numbers of I/O devices in the areas.

In another aspect of the invention, a computer program product comprises a computer usable medium having a computer readable program embodied in the medium, wherein the computer readable program when executed on a computing device causes the computing device to determine an offload scaling factor associated with an IC chip package based upon a current sharing factor of areas of the IC chip package and numbers of I/O devices in the areas.

In an even further aspect of the invention, there is method that comprises determining a first area on a chip having a highest number of I/O devices of areas on the chip, and determining a number of I/O devices in neighboring areas of the chip adjacent the first area. The method also includes determining an equivalent number of I/O devices in the first area based upon the number of I/O devices in the neighboring areas, determining an offload scaling factor based upon the equivalent number of I/O devices in the first area; and adjusting package inductance using the offload scaling factor.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention generally relates to systems and methods for modeling I/O simultaneous switching noise, and, more particularly, to systems and methods for modeling I/O simultaneous switching noise in a selected chip window area while accounting for the effect of current sharing among neighbors. Exemplary embodiments of the invention provide an "offload" method for use in SSO noise analysis that takes into account the effect of the I/O driver densities of neighboring areas outside the region being modeled. According to aspects of the invention, this is accomplished by first determining a current sharing factor between neighboring areas of the chip being modeled. In embodiments, the current sharing factor is used to determine an offload scaling factor for the area of the chip having the most I/O drivers. The offload scaling factor can be used to determine an adjusted package inductance, which can be used in an SSO noise analysis. In this manner, implementations of the invention provide a more accurate power supply noise effect, fewer convergence issues, and faster runtimes, without simulating a much larger and more complex model.

Figure 1:
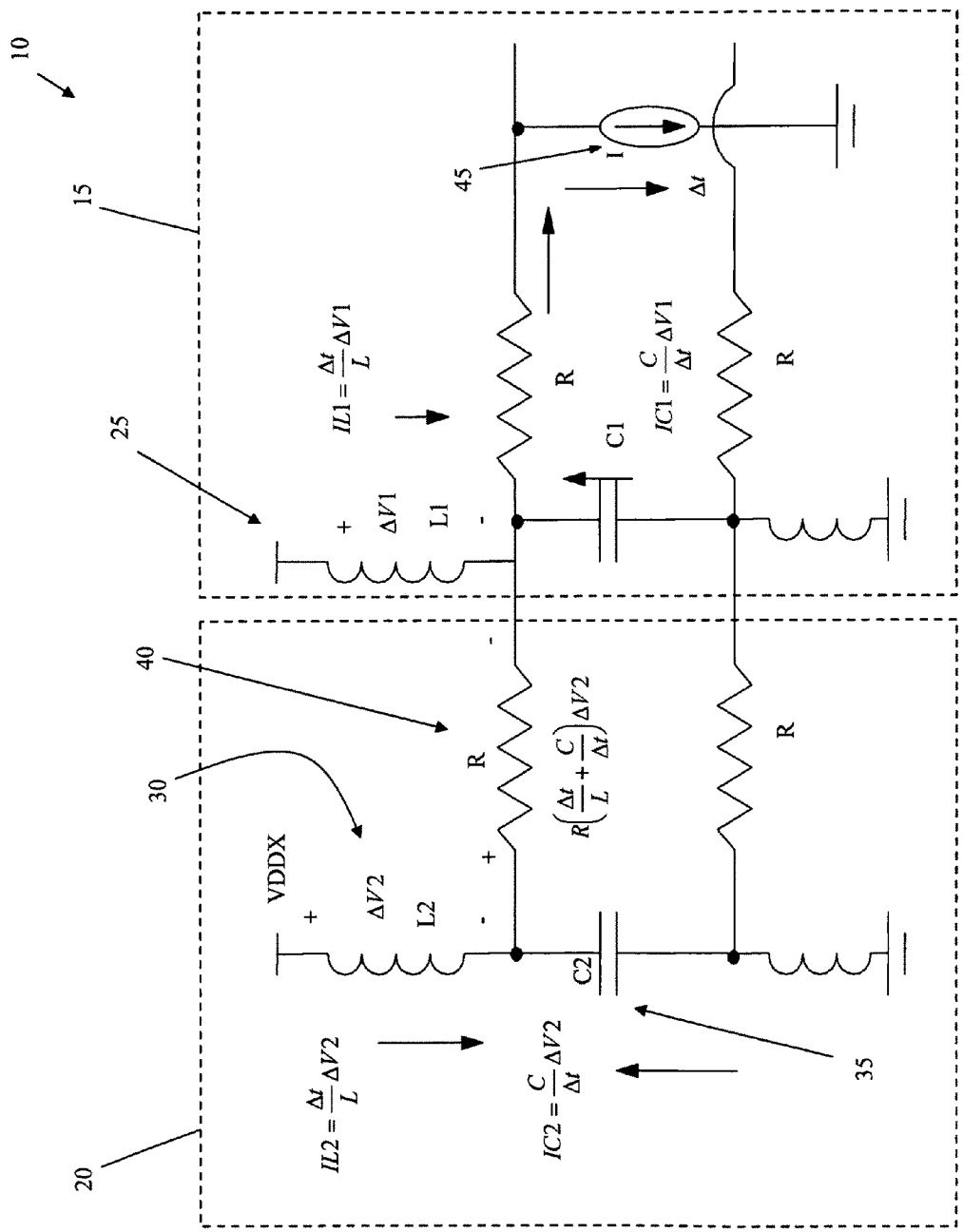
FIG. 1 shows an exemplary model area and adjacent area of a chip package according to aspects of the invention.

FIG. 1 shows a schematic representation of a package 10 (e.g., an IC chip package) including an area 15 to be modeled (e.g., for SSO noise simulation) and an adjacent area 20. In embodiments, areas 15 and 20 have the same physical size, and contain the same type of I/O devices (e.g., CMOS drivers and/or receivers, although the invention is not limited to these types of I/O devices).

The schematic depicted in FIG. 1 approximates an actual circuit model as a lump RLC whose behavior closely follows the actual distributed behavior of the circuit model. For example, VDDX represents the source voltage for the package, wire 25 represents a package power pin, inductor 30 represents the package inductance, capacitor 35 represents the on chip power bus capacitance, and resistor 40 linking areas 15 and 20 represents the on chip power bus resistance. Moreover, Δt represents the rise time of the I/O drivers of the package chip, and current 45 represents the I/O current for rising edge (e.g., the current drawn by the I/O drivers when driving a signal net high).

FIG. 1 shows expressions for: current IL2 through inductor L2; current IC2 through capacitor C2; current IL1 through inductor L1; and current IC1 through capacitor C1. From these expressions, a current sharing factor (e.g., a voltage compression) between the two areas 15 and 20 may be derived. From Kirchoff's voltage law, and when L1=L2=L and C1=C2=C, the voltage across the on chip power bus resistor 40 is given as:

$$\Delta V2 + R\Delta V2\left(\frac{\Delta t}{L} + \frac{C}{\Delta t}\right) = \Delta V1 \qquad \text{Equation 1}$$

Equation 1 can be rearranged to provide a formula for a current sharing factor (e.g., voltage compression) between the two areas 15, 20 as:

$$\frac{\Delta V2}{\Delta V1} = \frac{1}{1 + R\left(\frac{\Delta t}{L} + \frac{C}{\Delta t}\right)} \qquad \text{Equation 2}$$

In an exemplary embodiment comprising an ASIC wirebond design for sixteen I/O areas, R is about 0.5 Ohm, L is about 1 nH, C is about 184 pF, and Δt is about 0.4 ns. This results in a current sharing factor (e.g., the ratio of ΔV2/ΔV1) of about 0.7. This current sharing factor indicates that there is about 70% current sharing between the model area 15 and the adjacent area 20. Although the current sharing factor has been described with respect to areas 15, 20 having sixteen I/O's and specific values for R, L, C, and Δt, the invention is not limited to this specific example; rather, the above-described derivation may be used according to aspects of the invention to determine an appropriate current sharing factor for any desired arrangement of areas in an IC chip package having any desired number of I/O areas and any suitable values for R, L, C, and Δt.

When areas of a package have the same type of I/O drivers, the amount of current associated with each area is directly proportional to the number of I/O drivers in each respective area. Accordingly, the current sharing factor described above (e.g., Equation 2) can be used to determine an equivalent number of I/O drivers in an area based upon the actual number of I/O drivers in that area and the actual number of I/O drivers in an adjacent area. For example, FIGS. 2A-2C show an exemplary progression of determining equivalent numbers of I/O drivers in package areas according to aspects of the invention.

Reference numerals 60, 61, 62, 63, and 64 represent respective adjacent areas of an IC chip package. Specifically referring to FIG. 2A, area 60 actually contains 6 I/O drivers, area 61 contains 10 I/O drivers, area 62 contains 12 I/O drivers, area 63 contains 4 I/O drivers, and area 64 contains 8 I/O drivers. For a given chip package, the definition of areas (e.g., windows) and the number of I/O's (e.g., I/O device) per area may be determined from a netlist, which is known such that further explanation is not believed necessary.

Conventional SSO noise analysis would determine the worst case noise scenario by analyzing the noise of the area having the highest I/O device density (e.g., area 62 in this example). However, such conventional techniques provide an overly pessimistic result because such techniques ignore the effects of current sharing between the respective areas.

Figure 2A:
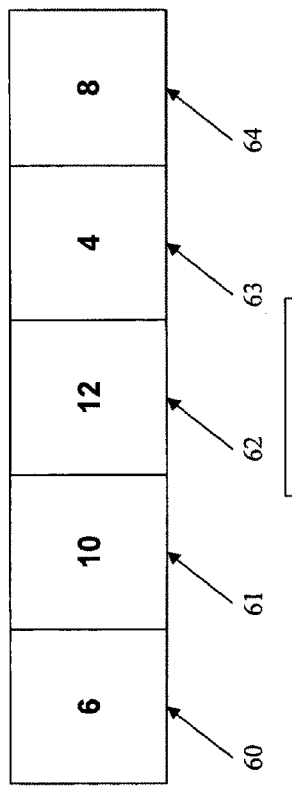
FIGS. 2A-2C show an exemplary progression of determining an equivalent numbers of I/O drivers in package areas according to aspects of the invention.
Figure 2B:
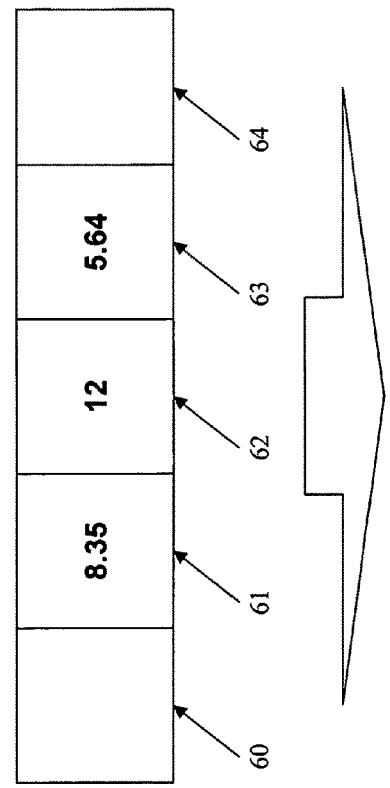
Figure 2C:
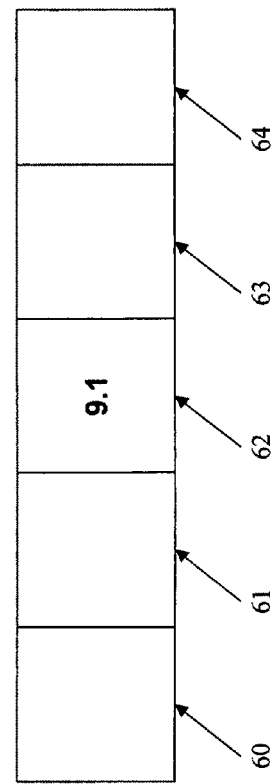

In contrast, embodiments of the invention use a current sharing factor (e.g., that determined using Equation 2) to take into account the current sharing amongst adjacent areas (e.g., 60-64 as shown in FIG. 2A) of the package. In this manner, an SSO noise analysis may be more closely related to the actual behavior of the circuit. For example, by using techniques according to aspects of the invention, an equivalent number of I/O's may be determined for an area of the package based upon, inter alia, a current sharing factor and characteristics of adjacent areas of the package. More specifically, the following expressions provide for determining an equivalent number of I/O's in an area based upon the following factors: number of I/O drivers in the area (represented by X), number of I/O's in the adjacent area (represented by Y), and current sharing factor (represented by Z). When X is greater than Y, the equivalent number of I/O's is expressed by:

$$E_{Area} = ((X-Y)/(1+Z)) + Y \qquad \text{Equation 3}$$

$$E_{Adjacent} = ((X-Y)/(1+Z))*Z + Y \qquad \text{Equation 4}$$

where:
$E_{Area}$ is the equivalent number of I/O's in the area;
$E_{Adjacent}$ is the equivalent number of I/O's in the adjacent area;
X is the number of I/O's in the area;
Y is the number of I/O's in the adjacent area; and
Z is the current sharing factor.

Conversely, when Y is greater than X, then the number of equivalent I/O's in each respective area is provided by:

$$E_{Area} = ((Y-X)/(1+Z))*Z + X \qquad \text{Equation 5}$$

$$E_{Adjacent} = ((Y-X)/(1+Z)) + X \qquad \text{Equation 6}$$

Referring to the example depicted in FIG. 2A, an equivalent number of I/O's can be determined for area 61 based upon the number of I/O's in areas 60 and 61 and a current sharing factor. For example, using a current sharing factor of 0.7 and Equation 3, the equivalent number of I/O's in area 61 can be determined to be about 8.35, as shown in FIG. 2B. Similarly, based upon the number of I/O's in areas 63 and 64, and a current sharing factor of 0.7, Equation 5 can be used to determine that the equivalent number of I/O's in area 63 is about 5.64, as shown in FIG. 2B.

As seen in FIG. 2B, area 62 has two adjacent neighboring areas 61 and 63. According to aspects of the invention, an equivalent number of I/O's for such an area (e.g., area 62) is determined by taking into account: the number of I/O's in the area, the already-determined equivalent number of I/O's in both adjacent areas, and the current sharing factor. More specifically, the equivalent number of I/O's in such an area (e.g., area 62) may be expressed as:

$$E_{Area}=(X-Y_{Avg})/(1+Z+Z)+Y_{Avg} \quad \text{Equation 7}$$

where:
$E_{Area}$ is the equivalent number of I/O's in the area;
X is the number of I/O's in the area;
$Y_{Avg}$ is the average of the equivalent number of I/O's in the two adjacent areas; and
Z is the current sharing factor.

Thus, as shown in FIG. 2C, the equivalent number of I/O's in area 62 is about 9.1. In embodiments of the invention, an offload scaling factor equals the ratio of the equivalent number of I/O's in area to the actual number of I/O's in the area. In the example shown in FIGS. 2A-2C, the offload scaling factor for area 62 equals 9.1 divided by 12, which is about 0.76. In further embodiments, an adjusted package inductance is determined by multiplying the real package inductance by the offload scaling factor. The adjusted package inductance may be used in an SSO noise simulation, and the simulation will more closely match the true behavior of the system including signal to signal coupling.

The invention is not limited to the values used in the examples described above with respect to FIGS. 2A-2C. Rather, by utilizing features of the invention described herein, a current sharing factor, offload scaling factor, and adjusted package inductance may be determined for any desired IC chip package.

Figure 3:
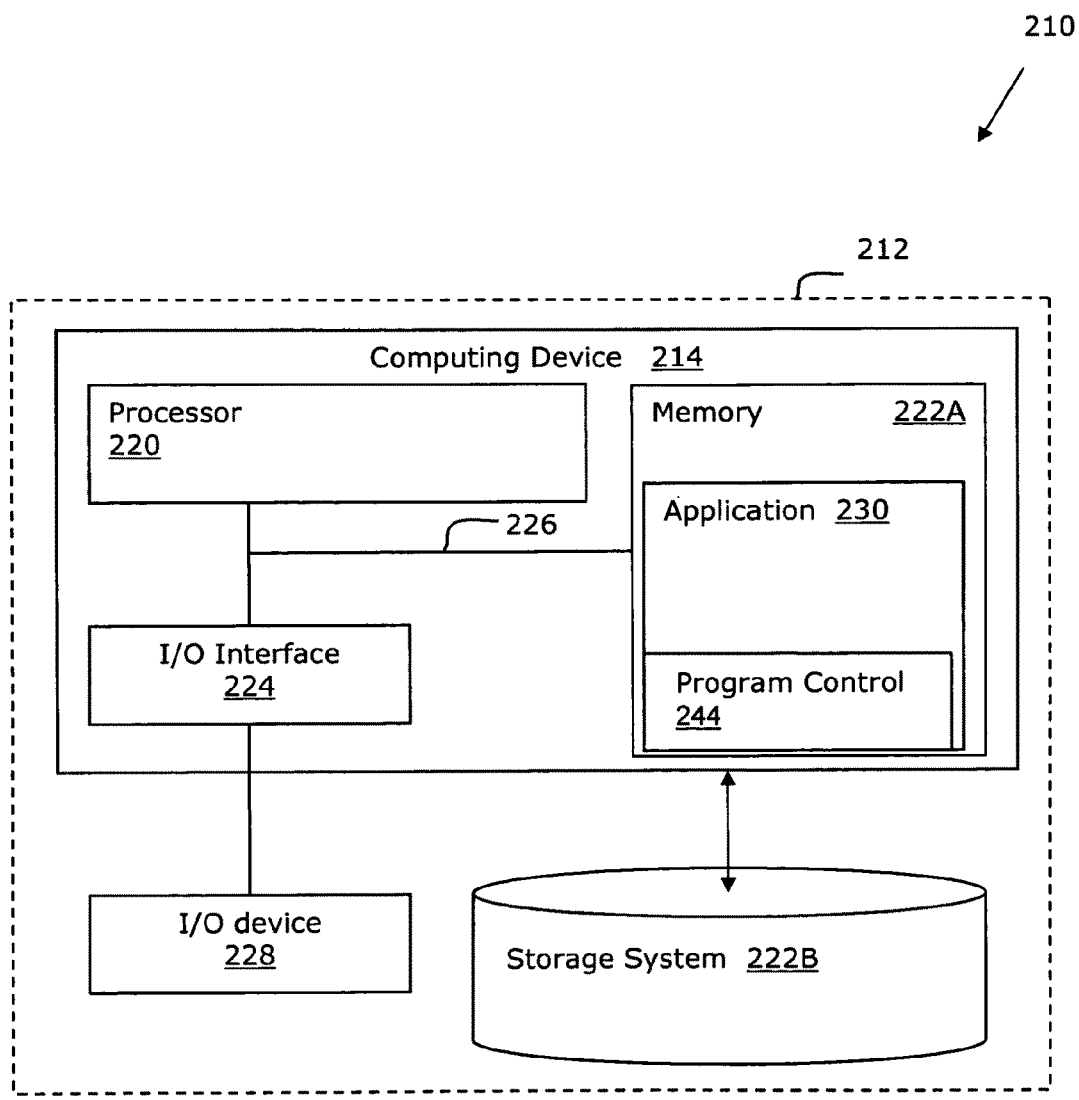
FIG. 3 shows an illustrative environment for implementing the steps in accordance with the invention.

FIG. 3 shows an illustrative environment 210 for managing the processes in accordance with the invention. To this extent, the environment 210 includes a computer infrastructure 212 that can perform the processes described herein. In particular, the computer infrastructure 212 includes a computing device 214 that comprises an application 230 having a program control 244, which makes the computing device 214 operable to perform the processes described herein, such as, for example, determining an offload scaling factor.

The computing device 214 includes a processor 220, a memory 222A, an input/output (I/O) interface 224, and a bus 226. The memory 222A can include local memory employed during actual execution of program code, bulk storage, and cache memories which provide temporary storage of at least some program code (e.g., program control 244) in order to reduce the number of times code must be retrieved from bulk storage during execution.

Further, the computing device 214 is in communication with an external I/O device/resource 228 and a storage system 222B. The I/O device 228 can comprise any device that enables an individual to interact with the computing device 214 or any device that enables the computing device 214 to communicate with one or more other computing devices using any type of communications link. The external I/O device/resource 228 may be keyboards, displays, pointing devices, etc.

The processor 220 executes computer program code (e.g., program control 244), which is stored in memory 222A and/or storage system 222B. While executing computer program code, the processor 220 can read and/or write data to/from memory 222A, storage system 222B, and/or I/O interface 224. The bus 226 provides a communications link between each of the components in the computing device 214.

The computing device 214 can comprise any general purpose computing article of manufacture capable of executing computer program code installed thereon (e.g., a personal computer, server, wireless notebook, smart phone, personal digital assistant, etc.). However, it is understood that the computing device 214 is only representative of various possible equivalent computing devices that may perform the processes described herein. To this extent, in embodiments, the functionality provided by the computing device 214 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 212 is only illustrative of various types of computer infrastructures for implementing the invention. For example, in embodiments, the computer infrastructure 212 comprises two or more computing devices (e.g., a server cluster) that communicate over any type of communications link, such as a network, a shared memory, or the like, to perform the processes described herein. Further, while performing the processes described herein, one or more computing devices in the computer infrastructure 212 can communicate with one or more other computing devices external to computer infrastructure 212 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a primary service provider, such as a Solution Integrator, could offer to perform the processes described herein, such as, for example, determining an offload scaling factor. In this case, the primary service provider can create, maintain, deploy, support, etc., a computer infrastructure that performs the process steps of the invention for one or more customers. In return, the primary service provider can receive payment from the customer(s) under a subscription and/or fee agreement and/or the primary service provider can receive payment from the sale of advertising content to one or more third parties.

Processes of the Invention

Figure 4:
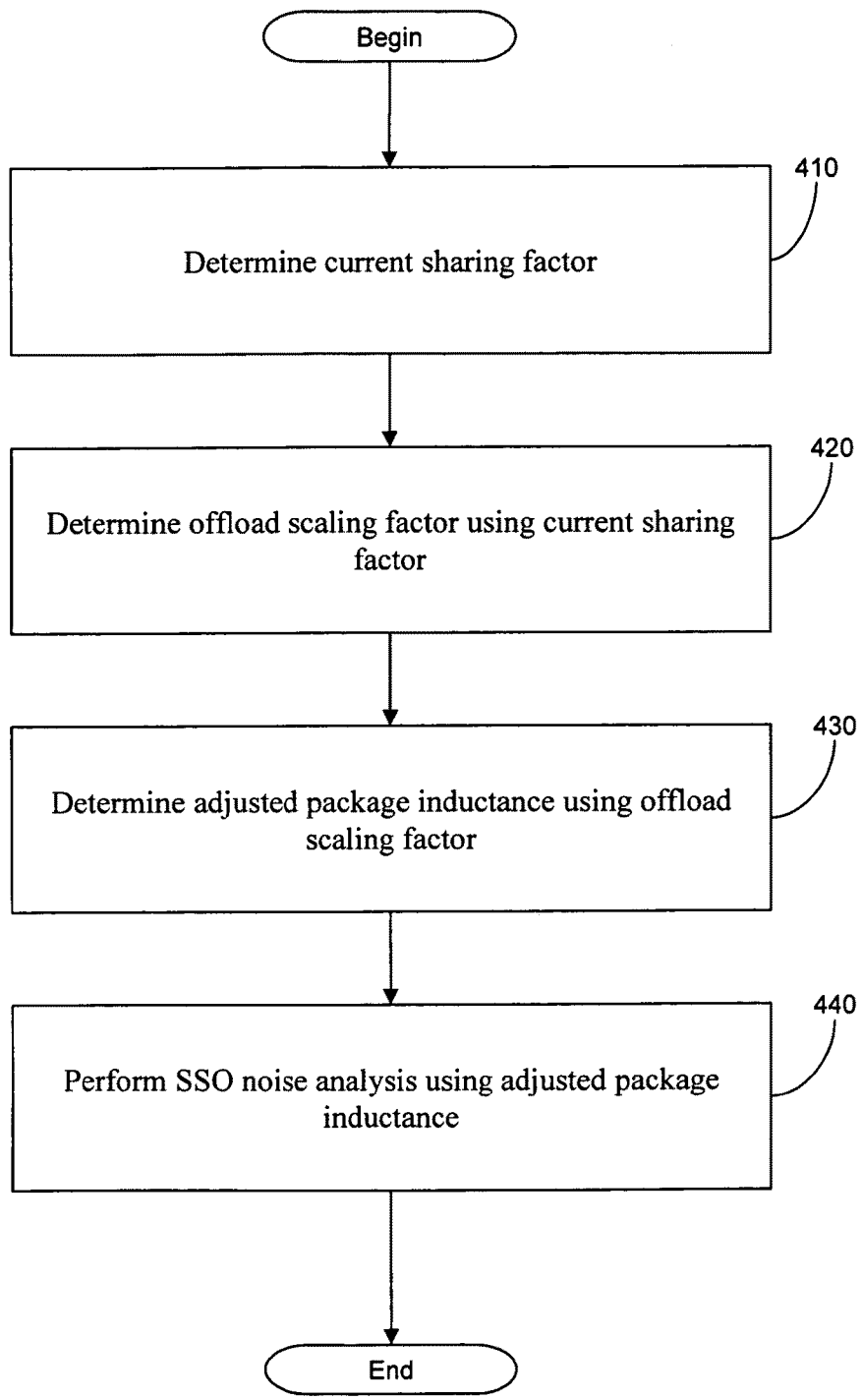
FIG. 4 shows a flow diagram depicting implementations of a method according to aspects of the invention.

FIG. 4 is a flow diagram implementing steps in accordance with aspects of the invention. The steps of the flow diagram described herein may be implemented in the environment of FIG. 3. The flow diagram may equally represent a high-level block diagram of the invention. The steps of the flow diagram may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environment of FIG. 3. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

More specifically, FIG. 4 shows a flow diagram depicting steps of a method for determining an offload scaling factor for use in SSO noise analysis according to aspects of the invention. At step 410, a current sharing factor for areas of an IC chip package is determined. In embodiments, this comprises modeling areas of the package as shown in FIG. 1 and determining the current sharing factor according to Equation 2. This may be accomplished, for example, by manual methods and/or by using software (e.g., programming) arranged to perform at least one of extracting necessary data from a netlist, building a circuit model, and calculating the current sharing factor. Although a current sharing factor of about 0.7 is described in the example of FIGS. 1 and 2A-2C, the invention is not limited to this value; rather the value of the current sharing factor will depend upon the physical parameters of the circuit model (e.g., quantitative value of package inductance, on chip power bus capacitance, on chip power bus resistance, rise time, etc.).

At step 420, an offload scaling factor is determined for an area of the package. In embodiments, this comprises identifying the area (e.g., window) on the chip that has the highest number of I/O drivers. Determining areas of a chip being modeled and numbers of I/O drivers in each area are known, such that further explanation is not believed necessary. Once the areas and number of I/O's per area are determined, the offload scaling factor may be determined manually or automatically (e.g., using software programming).

Still referring to step 420, as described above with respect to FIGS. 2A-2C, the offload scaling factor is a ratio of an equivalent number of I/O's in the area having the highest number of I/O's to the actual number of I/O's in that area. The equivalent number of I/O's in the area having the highest number of I/O's may be determined, for example, as described with respect to FIGS. 2A-2C and by using appropriate ones of Equations 3-7. Although the example shown in FIGS. 2A-2C utilizes five areas of the IC chip package, the invention is not limited to this number of areas; rather any suitable number of areas may be used in determining the equivalent number of I/O's in the area having the highest number of actual I/O's.

At step 430, an adjusted package inductance is determined. This may be performed manually and/or automatically (e.g., via software programming). In embodiments, the adjusted package inductance equals the real package inductance (e.g., of the package being modeled) multiplied by the offload scaling factor (from step 420). The real package inductance is available (e.g., may be determined or approximated in a known manner) from package electrical data.

At step 440, an SSO noise simulation is performed using the adjusted package inductance from step 430. The SSO noise simulation may be performed on a computing device (such as, for example, that described with respect to FIG. 3) using a conventional simulation tool (e.g., SPICE). By using an adjusted package inductance that is based upon the offload scaling factor and the current sharing factor, the results of the SSO noise simulation of step 440 will accurately account for the effects of current sharing among the neighboring areas of the package. Moreover, by simulating a small area (e.g., window) instead of the entire IC, implementations of the invention greatly reduce the model complexity and run time.

Figure 5:
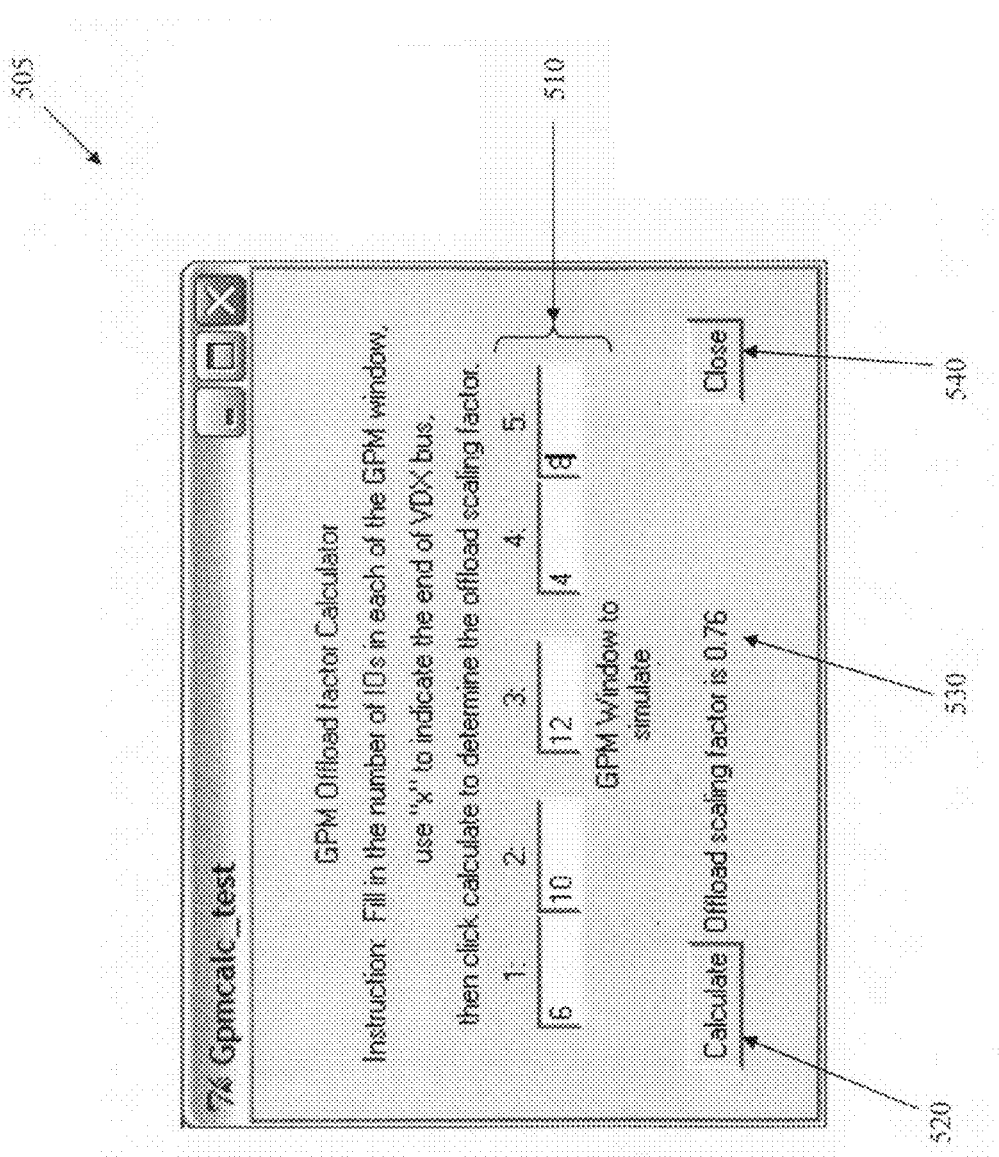
FIG. 5 shows an exemplary graphical user interface (GUI) according to aspects of the invention.

FIG. 5 shows an exemplary graphical user interface (GUI) 505 for automatically implementing aspects of the invention. The GUI 505 may be provided using a computing device, such as, for example, that described with respect to FIG. 3. The GUI 505 includes input fields 510 where a user may input the number of I/O's in respective areas (e.g., windows) of an IC chip package. The GUI 505 also includes a button or other control 520 (selectable, e.g., using a mouse) that causes the computing device to calculate (e.g., according to the methods described above) and display an offload scaling factor 530 based upon the values entered in fields 510. The GUI 505 also includes a button or other control 540 to close (e.g., terminate) the GUI 505.

While the invention has been described in terms of embodiments, those skilled in the art will recognize that the invention can be practiced with modifications and in the spirit and scope of the appended claims.

What is claimed is:

1. A method for improving simultaneous switching output (SSO) noise analysis, comprising:
determining, by a processor, a current sharing factor of areas of an integrated circuit (IC) chip package; and
determining an offload scaling factor of the IC chip package based upon the current sharing factor and numbers of I/O devices in neighboring areas of the IC chip package, to perform an SSO noise analysis,
wherein the current sharing factor is determined according to equation:

$$\frac{\Delta V2}{\Delta V1} = \frac{1}{1 + R\left(\frac{\Delta t}{L} + \frac{C}{\Delta t}\right)},$$

wherein $\Delta V1$ is a change in voltage of a package power pin, $\Delta V2$ is a change in voltage of package inductance, ($\Delta V2/\Delta V1$) is the current sharing factor, R is on chip power bus resistance, L is package inductance, C is on chip power bus capacitance, and $\Delta t$ is rise time of I/O devices of IC the chip package, and
wherein the determining the offload scaling factor includes determining an equivalent number of I/O devices in an area of the IC chip package having a highest number of actual I/O devices in comparison to numbers of actual I/O devices in areas of the IC chip package adjacent to the area of the IC chip package having the highest number of actual I/O devices.

2. The method of claim 1, wherein the I/O devices comprise I/O drivers.

3. The method of claim 1, further comprising determining an adjusted package inductance based upon the offload scaling factor and a real inductance of the IC chip package.

4. The method of claim 3, further comprising performing the SSO noise analysis using the adjusted package inductance.

5. The method of claim 1, wherein the equivalent number of I/O devices is based upon numbers of I/O devices in the areas of the IC chip package adjacent to the area of the IC chip package having the highest number of actual I/O devices.

6. The method of claim 1, wherein the equivalent number of I/O devices is based upon equivalent numbers of I/O devices in the areas of the IC chip package adjacent to the area of the IC chip package having the highest number of actual I/O devices.

7. The method of claim 6, wherein one of the equivalent numbers of I/O devices in the areas of the IC chip package adjacent to the area of the IC chip package having the highest number of actual I/O devices is determined according to $E_{Area}=((X-Y)/(1+Z))+Y$, wherein $E_{Area}$ is an equivalent number of I/O devices in a first area of the IC chip package adjacent to the area of the IC chip package having the highest number of actual I/O devices, X is a number of actual I/O devices in the first area, Y is a number of actual I/O devices in a second area of the IC chip package adjacent to the first area, Z is the current sharing factor, and X is greater than Y.

8. The method of claim 6, wherein one of the equivalent numbers of I/O devices in the areas of the IC chip package adjacent to the area of the IC chip package having the highest number of actual I/O devices is determined according to $E_{Area}=((Y-X)/(1+Z))*Z+X$, wherein $E_{Area}$ is an equivalent number of I/O devices in a first area of the IC chip package adjacent to the area of the IC chip package having the highest number of actual I/O devices, X is a number of actual I/O devices in the first area, Y is a number of actual I/O devices in a second area of the IC chip package adjacent to the first area, Z is the current sharing factor, and Y is greater than X.

9. The method of claim 6, wherein the equivalent number of I/O devices is determined according to $E_{Area}=(X-Y_{Avg})/(1+Z+Z)+Y_{Avg}$, wherein $E_{Area}$ is the equivalent number of I/O devices, X is the highest number of actual I/O devices, $Y_{Avg}$ is an average of the equivalent numbers of I/O devices, and Z is the current sharing factor.

10. The method of claim 1, wherein at least one of the determining the current sharing factor and the determining the offload scaling factor is performed by a service provider under a subscription and/or fee agreement and/or based on advertising content to one or more third parties.

11. The method of claim 1, wherein a service provider at least one of creates, maintains, deploys and supports a computer infrastructure that performs at least one of the determining the current sharing factor and the determining the offload scaling factor.

12. The method of claim 1, further comprising presenting a graphical user interface (GUI) that:
accepts as input numbers of I/O devices in areas of the IC chip package, and
outputs the offload scaling factor.

13. A method for performing a simultaneous switching output (SSO) noise analysis, comprising:
providing a computer infrastructure that is structured and arranged to:
determine a current sharing factor of areas of an integrated circuit (IC) chip package; and
determine an offload scaling factor of the IC chip package based upon the current sharing factor and numbers of I/O devices in neighboring areas of the IC chip package, to perform an SSO noise analysis,
wherein the determining the offload scaling factor includes determining an equivalent number of I/O devices in an area of the IC chip package having a highest number of actual I/O devices in comparison to numbers of actual I/O devices in areas of the IC chip package adjacent to the area of the IC chip package having the highest number of actual I/O devices,
wherein the current sharing factor is determined according to equation:

$$\frac{\Delta V2}{\Delta V1} = \frac{1}{1+R\left(\frac{\Delta t}{L}+\frac{C}{\Delta t}\right)}, \text{ and}$$

wherein $\Delta V1$ is a change in voltage of a package power pin, $\Delta V2$ is a change in voltage of the package inductance, $(\Delta V2/\Delta V1)$ is the current sharing factor, R is the on chip power bus resistance, L is the package inductance, C is the on chip power bus capacitance, and $\Delta t$ is the rise time of I/O devices of the IC the chip package.

14. The method of claim 13, wherein the computer infrastructure is further structured and arranged to determine an adjusted package inductance based upon the offload scaling factor and a real inductance of the IC chip package.

15. The method of claim 14, wherein the computer infrastructure is further structured and arranged to perform the SSO noise analysis using the adjusted package inductance.

16. The method of claim 13, wherein the determining the offload scaling factor includes determining an equivalent number of I/O devices in an area of the IC chip package having a highest number of actual I/O devices.

17. The method of claim 16, wherein the equivalent number of I/O devices is based upon numbers of I/O devices in the areas of the IC chip package adjacent to the area of the IC chip package having the highest number of actual I/O devices.

18. A computer program product comprising a tangible computer usable storage memory having a computer readable program embodied in the tangible computer usable storage memory, wherein the computer readable program when executed on a computing device is operable to cause the computing device to:
determine a current sharing factor of areas of an integrated circuit (IC) chip package; and
determine an offload scaling factor of the IC chip package based upon the current sharing factor and numbers of I/O devices in neighboring areas of the IC chip package, to perform an SSO noise analysis,
wherein the current sharing factor is determined according to equation:

$$\frac{\Delta V2}{\Delta V1} = \frac{1}{1+R\left(\frac{\Delta t}{L}+\frac{C}{\Delta t}\right)},$$

wherein $\Delta V1$ is a change in voltage of a package power pin, $\Delta V2$ is a change in voltage of the package inductance, $(\Delta V2/\Delta V1)$ is the current sharing factor, R is the on chip power bus resistance, L is the package inductance, C is the on chip power bus capacitance, and $\Delta t$ is the rise time of I/O devices of the IC the chip package, and
wherein the determining the offload scaling factor includes determining an equivalent number of I/O devices in an area of the IC chip package having a highest number of actual I/O devices in comparison to numbers of actual I/O devices in areas of the IC chip package adjacent to the area of the IC chip package having the highest number of actual I/O devices.

19. The computer program product of claim 18, wherein the computer readable program is further operable to cause the computing device to:
determine an adjusted package inductance based upon the offload scaling factor and a real inductance of the IC chip package; and perform the SSO noise analysis using the adjusted package inductance, and the equivalent number of I/O devices is based upon numbers of I/O devices in the areas of the IC chip package adjacent to the area of the IC chip package having the highest number of actual I/O devices.

* * * * *